United States Patent [19]
Culbertson

[11] Patent Number: 5,519,626
[45] Date of Patent: May 21, 1996

[54] METHOD OF DIVIDING A PIPELINED STAGE INTO TWO STAGES IN A COMPUTER-AIDED DESIGN SYSTEM

[75] Inventor: Bruce Culbertson, Palo Alto, Calif.

[73] Assignee: Hewlett-Packard Company, Palo Alto, Calif.

[21] Appl. No.: 89,006

[22] Filed: Jul. 9, 1993

[51] Int. Cl.[6] ............................. G06F 17/50; G06F 9/38
[52] U.S. Cl. ...................... 364/488; 364/491; 395/500
[58] Field of Search .................................. 364/488, 489, 364/490, 491, 578; 395/919, 920, 921, 922, 500, 800

[56] References Cited

U.S. PATENT DOCUMENTS

| | | | |
|---|---|---|---|
| 3,875,391 | 4/1975 | Shapiro et al. | 364/736 |
| 4,807,183 | 2/1989 | Kung et al. | 364/900 |
| 5,133,069 | 7/1992 | Asato et al. | 395/800 |
| 5,175,843 | 12/1992 | Casavant et al. | 395/500 |
| 5,212,782 | 5/1993 | Asato et al. | 395/500 |
| 5,341,322 | 8/1994 | Fettweis et al. | 364/764 |

FOREIGN PATENT DOCUMENTS

WO90/08362  7/1990  WIPO ............................. G06F 15/60

OTHER PUBLICATIONS

Prabhu, Usha and Panngle, Barry M.; "Superpipelined Control and Data Path Synthesis" 29th ACM/IEEE Design Automation Conference, 1992, pp. 638–643.
Kaiser et al., "Risp: A Digital Signal Processor Architecture with Reduced Instruction Set Tailored to Wave Digital Filters", IEEE 92, pp. 32–35.
Hung et al., "High–Level Synthesis with Pin Constraints for Multiple–Chip Designs", IEEE 92, pp. 231–234.

*Primary Examiner*—Vincent N. Trans
*Assistant Examiner*—Tan Q. Nguyen

[57] ABSTRACT

A method, practiced in a CAD system, of automatically dividing a pipeline stage into two. A designer specifies a desired signal processing time for division of the stage. The CAD system automatically identifies circuit locations that meet the specified signal processing time and divides the stage at those points, providing new netlists for the new stages.

2 Claims, 8 Drawing Sheets

METHOD OF DIVIDING A PIPELINED STAGE INTO TWO STAGES IN A COMPUTER-AIDED DESIGN SYSTEM

BACKGROUND OF THE INVENTION

The present invention relates generally to computer-aided design systems and more particularly to a method of automatically designing pipelined stages by dividing a combinational circuit into parts in a computer-aided design system.

Computer-aided design ("CAD") systems have become increasingly sophisticated and have automated many aspects of the design of complex machines. One type of complex machine that can be designed with the aid of a CAD system is an electronic device such as a computer. A CAD system cannot design an entire computer but it can be of tremendous value to a human computer designer. One way that a CAD system can assist the designer is by automatically generating a netlist for an overall circuit that the designer has created. A "netlist" is a detailed description of a combination of elementary electronic circuit elements that make up such an overall circuit. For example, a netlist may specify a logic AND gate having an output connected to first input of a logic OR gate, and so on. A netlist may include many thousands of circuit elements and all the interconnections therebetween.

Existing CAD systems can assist a computer system designer not only by generating netlists but also by automating certain of the tasks involved in designing some kinds of logic circuits. For example, a CAD system that can modify a design of an adder in response to a request from a designer is described in U.S. patent application Ser. No. 08/031,775, filed Mar. 15, 1993 and owned by the same assignee as the present application, the contents of which are incorporated herein by this reference.

Figure 1:
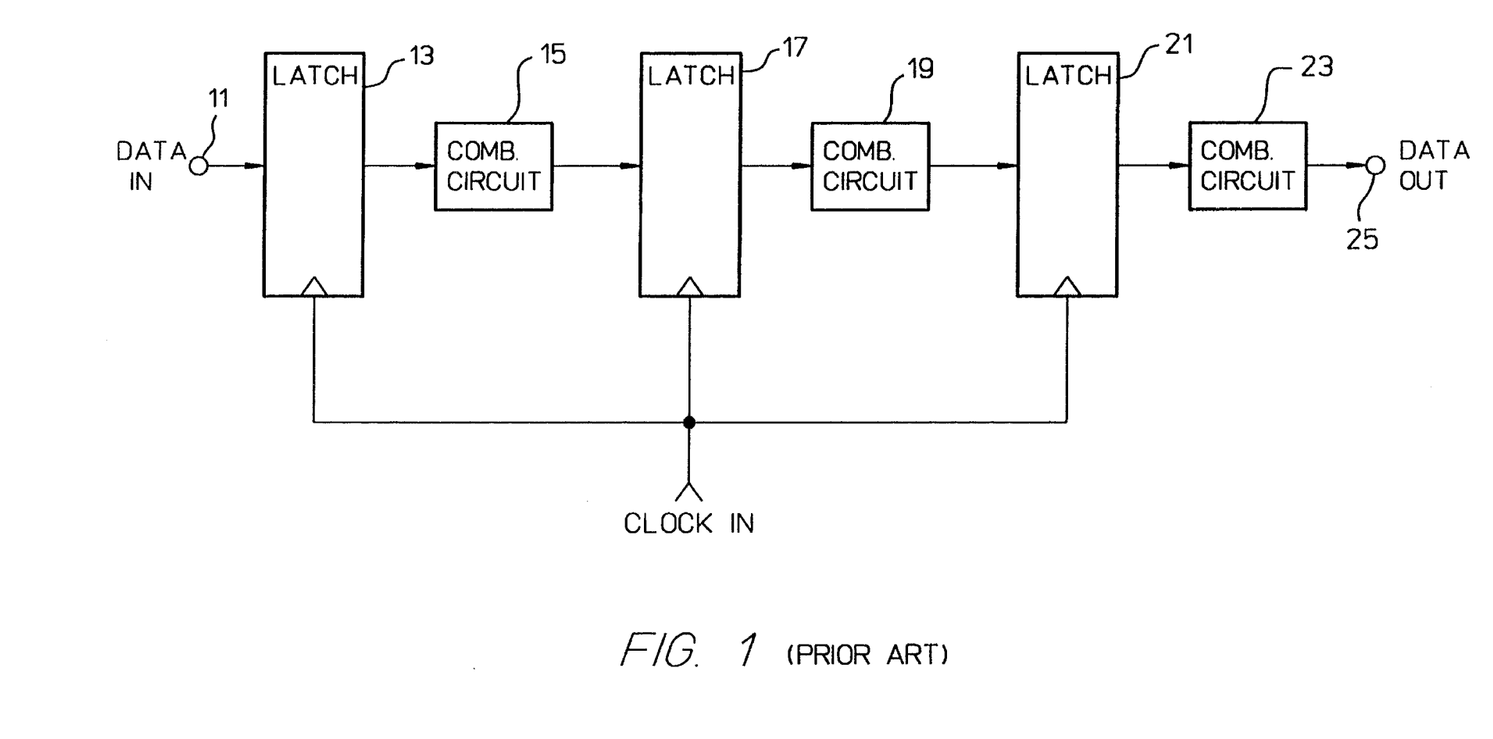
FIG. 1 is a block diagram of a pipelined computer circuit according to the prior art.

An approach to computer architecture that is becoming of greater importance is pipelining. Pipelining may be described as a technique of breaking a sequential process into several subprocesses and executing the various subprocesses concurrently. A simple example of a portion of a computer that implements this technique is shown in FIG. 1. Data is received at an input port 11 and latched into a first latch 13 upon the occurrence of a clock pulse. Once the data is latched into the latch 13, it is provided to a first stage 15. This first stage 15 typically comprises a combinational circuit such as an adder or most any other type of logic circuit that is desired. The output of the combinational circuit 15 is latched into a second latch 17 on the next clock pulse and is thereupon provided to a second stage 19 which is also a combinational circuit. The logic of the second stage may or may not be similar to that of the first. The output of the second stage is in turn latched into a third latch 21 on the next clock pulse and provided to a third stage 23. The third stage provides its output at a data output 25.

From the foregoing description it will be apparent that each stage performs its task concurrently with the others, but with different inputs. The stages of a pipeline may be compared to a row of workers on an automobile assembly line. Each worker performing a different task. All the workers perform their tasks concurrently, but each works on a different car at any one time. When each worker has performed his/her task on one car, all the cars are advanced to the next stage on the assembly line.

An example of a task that a pipelined computer can perform much faster than a simple sequential computer is the task of adding two floating-point numbers. A floating-point number is a number that is expressed in the form $A \times 10^B$, where A (the mantissa) is a decimal fraction between zero and one and B (the exponent) is an integer. The task of adding two floating-point numbers requires three steps: align the mantissas, sum the mantissas, and normalize the result. In a sequential computer, each of these steps must be performed separately. If each step takes one unit of time, the computer will need three units of time to add the two numbers. In a complicated scientific calculation there may be thousands of such additions to be performed. The time required to perform all these additions could be reduced by a factor of three if the computer could perform all three steps in a single unit of time.

It is not possible to perform all three steps of one addition simultaneously, because each step after the first requires the output of the preceding step. However, by pipelining, the steps of a series of additions can be overlapped. Thus, the second step of one addition can be performed concurrently with the first step of the next following addition, and so on. With reference to FIG. 1, this is done by designing the first combinational circuit 15 as a mantissa aligner, the second combinational circuit 19 as a mantissa adder, and the third combinational circuit 23 as a result normalizer. The first two floating-point numbers to be added, say $X_1=0.95\times10^3$ and $Y_1=0.82\times10^2$, are latched into the first latch 13 and presented to the mantissa aligner. The mantisssa aligner converts $Y_1$ to the form $Y_1'=0.082\times103$ and presents both numbers to the second latch 17. On the next clock pulse, $X_1$ and $Y_1'$ are presented to the mantissa adder and simultaneously the second two numbers to be added, $X_2$ and $Y_2$, are presented to the mantissa aligner. While the mantissa adder is adding $X_1$ and $Y_1'$ to get $1.032\times10^3$, the mantissa aligner is aligning $X_2$ and $Y_2$. On the next clock pulse, the result from the mantissa adder is latched through the latch 21 to the result normalizer; meanwhile, the aligned $X_2$ and $Y_2$ are presented to the mantissa adder and the third two numbers to be added, $X_3$ and $Y_3$, are presented to the mantissa aligner. The result normalizer converts $1.32\times10^3$ to $0.132\times10^4$; simultaneously, the mantissa adder adds $X_2$ and $Y_2$ while the mantissa aligner aligns $X_3$ and $Y_3$. Thus, once three numbers are in the pipeline, a new result is produced every unit of time.

More information on computer pipelining may be found in such reference texts as Hennessy & Patterson, *Computer Architecture*: A Quantitative Approach, Morgan Kaufmann Pub., 1990, ch. 6; Stone (ed.), *Introduction to Computer Architecture* (2d Ed.), SRA Inc., 1980, ch. 9; and Mano, *Computer System Architecture* (2d Ed.), Prentice-Hall, 1982, pp. 277 et seq.

From the foregoing it will be apparent that many kinds of repetitive computational tasks can be executed faster in a pipelined computer than in a simple sequential one. It will also be apparent that the combinational circuits which make up the various stages of a pipeline sometimes must be specially designed for a specific task or for a group of related tasks. Thus, in designing a pipelined computer, the designer must design one or several pipelines for those tasks which can best be performed in a pipelined system. Which tasks should be performed in a pipelined system, and which stages the pipeline should have, are factors that in general will be decided by the designer so as to best satisfy whatever design specifications the designer has created (or has been given).

A task that a computer designer must often perform is to divide a pipeline stage in two. To do this requires calculating signal processing times at many points in the logic circuitry that makes up the stage, identifying those points at which the circuit can be divided without getting the various signals out of sync with each other, and determining at which points to make the division according to how much processing time is desired in each of the new stages into which the existing stage is to be divided. A CAD system that could perform this task automatically would be of great value to computer system designers.

SUMMARY OF THE INVENTION

The present invention provides a method of automatically dividing a pipeline stage in two by means of a CAD system according to a desired signal processing time in the new stages into which the existing stage is to be divided. Existing methods of pipeline circuit design have required a large amount of time and effort of a human designer in performing such a division of stages. The invention enables the CAD system to divide an arbitrary combinational logic circuit automatically, enabling the designer to work more efficiently.

Briefly and in general terms, the method of the invention begins with the step of storing in a CAD system a description of an existing pipeline stage that is to be divided. This stage may have been designed with the aid of the CAD system or manually by the designer. The designer provides a criterion, typically a desired signal processing time, that is to be satisfied by the new stages which will result from dividing the existing stage. From there, the invention automatically computes a division point for each circuit branch in the existing pipeline stage and automatically revises the description of the existing pipeline stage into a description of two new stages: an input stage and an output stage. The new input stage includes all the circuitry between the inputs of the existing stage and the division points, and the new output stage includes all the circuitry between the division points and the outputs of the existing stage.

In one embodiment the criterion is a desired signal processing time through the new input stage which is to be created. The division points are automatically computed as follows. First, each circuit element that provides an output of the existing pipeline stage is identified. These circuit elements typically are logic gates such as AND or OR gates or combinations of such gates. One of these circuit elements is selected and one of its inputs is chosen. Then the system computes the maximum signal processing time from the input of the existing stage through any possible circuit path to the chosen input. If this time exceeds the desired signal processing time, that circuit element which provides the chosen input is also identified; if this time does not exceed the desired signal processing time, the chosen input is identified as a tentative division point. These steps are repeated until there are no more identified circuit elements. Finally, any tentative division points that receive a signal from a common source are combined into a single division point.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

As shown in the drawings for purposes of illustration, the invention is embodied in a novel method of automatically dividing a pipeline stage in two by means of a CAD system. Existing methods of designing pipeline circuits have required that a human designer perform such divisions manually. This invention enables the designer to work faster and with less drudgery by automating the task of dividing an arbitrary combinational logic circuit according to a simple criterion provided by the designer.

The method of the invention begins with a description of an existing pipeline stage. The designer provides a criterion for dividing this stage. From there, the invention automatically computes a division point for each circuit branch and revises the description of the existing pipeline stage into a description of two new stages, one on each side of the division points.

Figure 2:
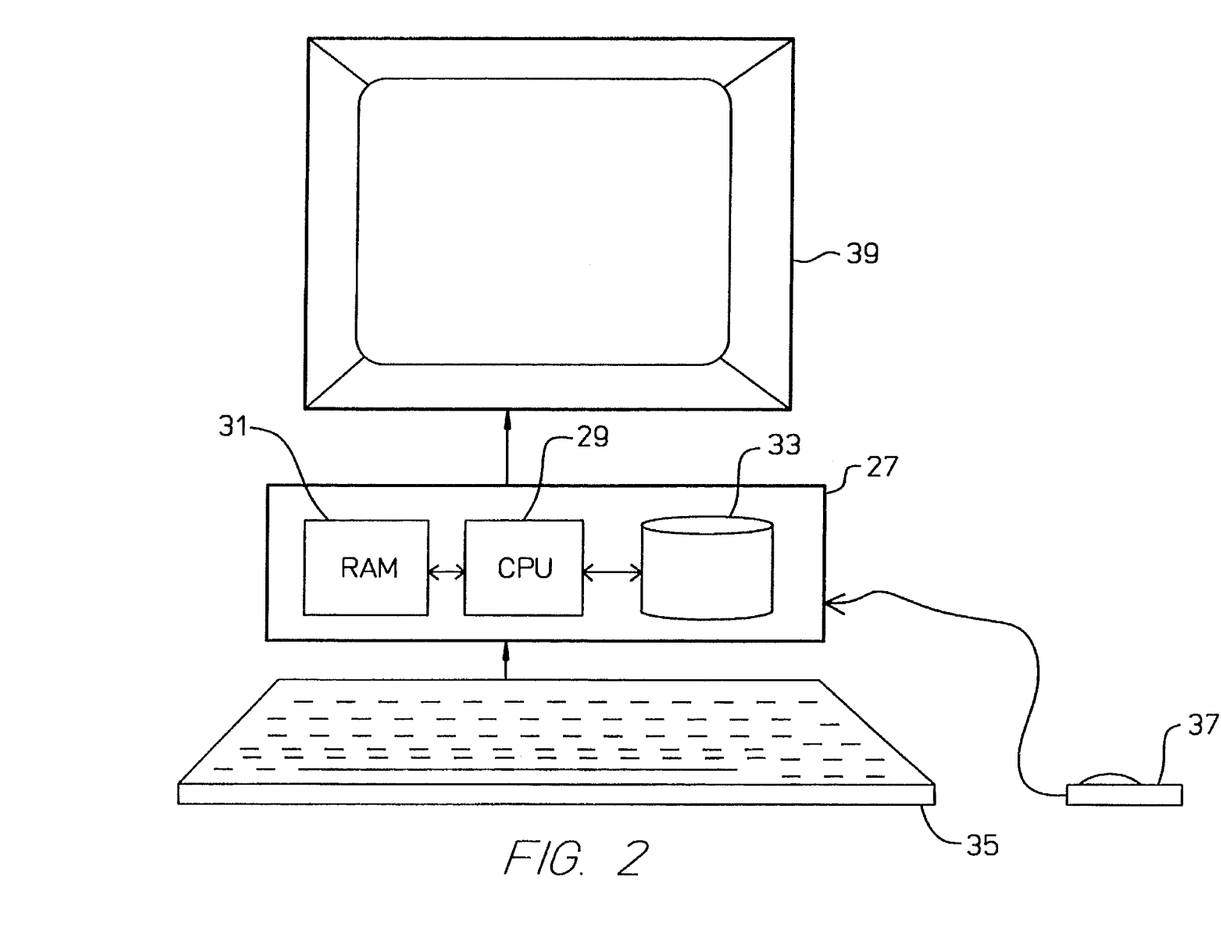
FIG. 2 is a block diagram of a computer-aided design system of the kind in which the invention is practiced.

The invention is preferably practiced in a CAD system of the kind shown in FIG. 2. A computer generally 27 includes a central processor ("CPU") 29, a random access memory ("RAM") 31 and storage such as a magnetic disk unit 33. A designer communicates with the computer through a keyboard 35 and a mouse 37 and observes the results on a display screen 39. The computer 27 may also be connected to a printer or other output device (not shown) as desired.

Software appropriate to the particular computer system and to the type of design which the system is to aid is stored in the computer, typically in the magnetic disk unit 33, and is loaded into RAM 31 as needed.

A simple example of a pipeline stage which a designer might wish to divide into two stages is shown in FIGS. 3 through 6. Input data are presented at a pair of data inputs 41 and 43 and are latched into a pair of latches 45 and 47, respectively, upon the occurrence of a clock pulse provided to a clock input 49. The data are processed by a combinational circuit generally 51 comprising a plurality of circuit elements 53 through 79. Output data are provided at data outputs 81 and 83.

Figure 3:
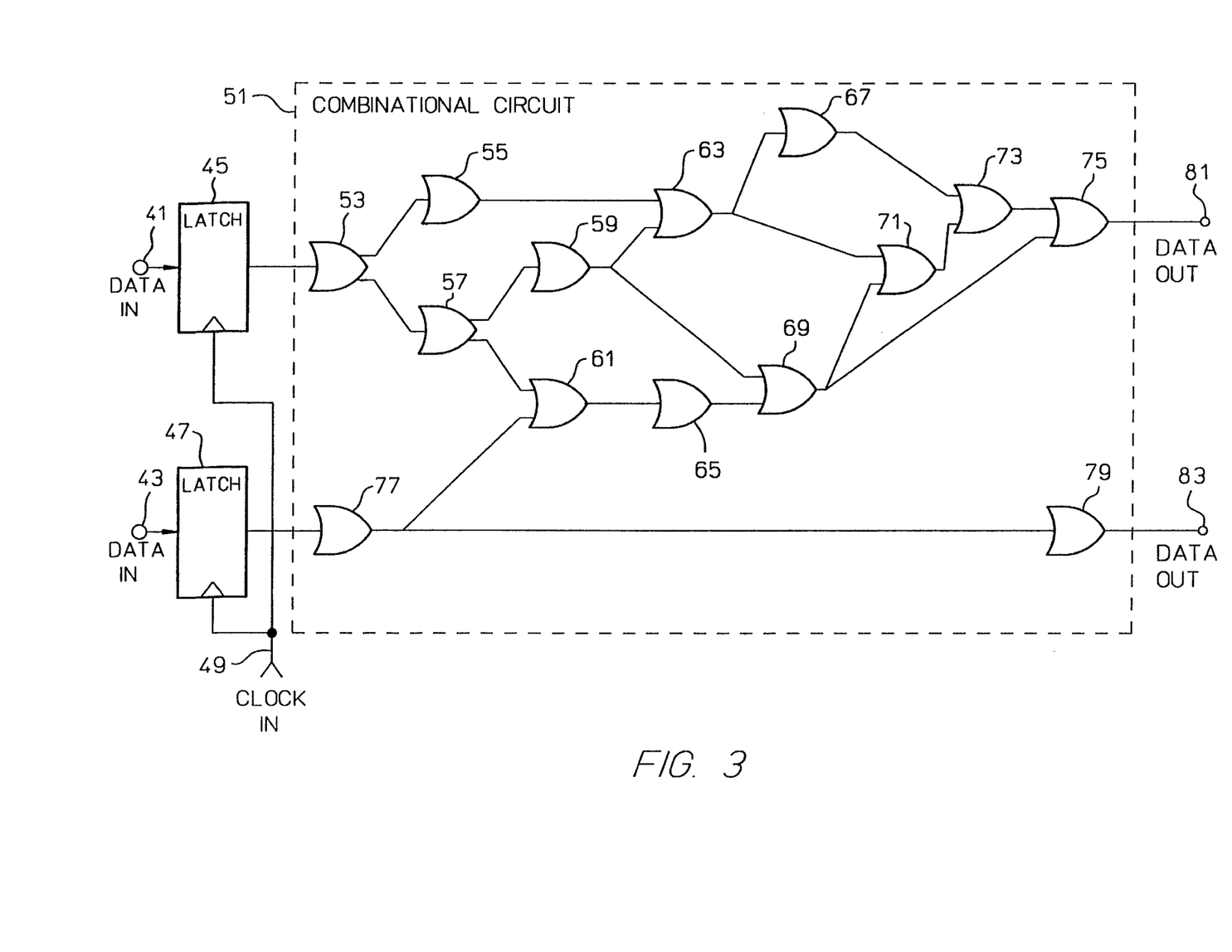
FIG. 3 is a partial schematic diagram of a pipeline stage that is to be divided into two pipeline stages according to the method of the invention.

The various elements 53 through 79 may be elementary logic gates such as AND gates and OR gates, aggregations of gates such as half adders and multiplexers, and the like. Some elements such as the element 53 may have but one input and a plurality of outputs. Others such as the element 63 may have a plurality of inputs and only one output. Others may have multiple inputs and multiple outputs. The overall combinational logic circuit 51 may have one or many inputs, one or many outputs, and a few or many thousands of circuit elements.

Each circuit element typically requires a finite amount of time to provide an output. In general, the amount of time required by one kind of element will be different from that required by another. To simplify the discussion herein, it will be assumed that all of the circuit elements 53 through 79 have the same processing times, but it will be apparent that the method of the invention is equally applicable to pipeline stages with elements that have various processing times.

Figure 7:
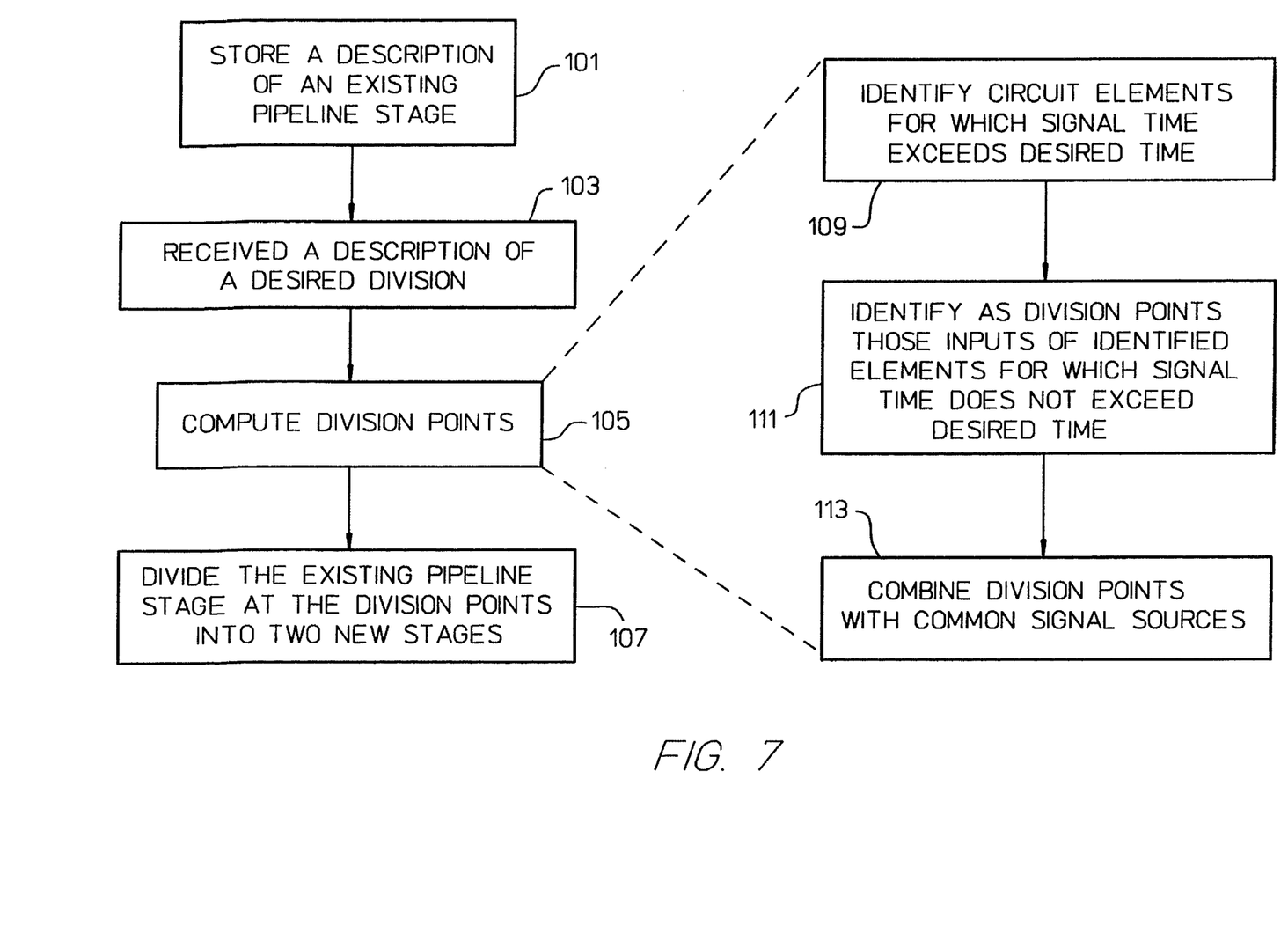
FIG. 7 is a flowchart illustrating the method of the invention.

The method of the invention will now be described in more detail with particular reference to FIG. 7. As described above, the steps of the method, as performed in a CAD system of the kind shown in FIG. 2, include storing in a storage area of the CAD system a description of an existing pipeline stage 51 that is to be divided (block 101); receiving a criterion descriptive of a desired division (block 103); automatically computing a division point for each circuit branch in the existing pipeline stage, each such division point satisfying the criterion (block 105); and automatically revising the description of the existing pipeline stage into a description of a new input pipeline stage and a new output pipeline stage, the new input pipeline stage including all the circuitry of the existing pipeline stage which provides signals to the division points, the new output pipeline stage including all the circuitry of the existing pipeline stage which receives signals from the division points (block 107).

The description of the existing stage 51 may be entered by the designer specifically for the purpose of having the CAD system divide the stage in two, or this description may already have been stored in the CAD as a result of previous design activity by the designer or by the CAD system itself.

Typically the existing pipeline stage comprises a plurality of circuit elements 53 to 79 each characterized by a signal processing time. The criterion comprises a desired signal processing time of the new input pipeline stage.

The step of automatically computing a division point preferably comprises identifying each circuit element for which the signal processing time from the input of the existing pipeline stage through any possible circuit path to the output of that circuit element exceeds the desired signal processing time (block 109); identifying as a tentative division point each input of each identified circuit element for which the signal processing time from the input of the existing pipeline stage through any possible circuit path to that input does not exceed the desired signal processing time (block 111); and combining any tentative division points that receive a signal from a common source into a single division point (block 113). A "circuit element" includes an output terminal of the stage such as the data outputs 81 and 83 as well as the gates and other elements within the stage; this ensures that an appropriate division point will be inserted between a stage output and a stage input if any data is passed through the stage from said input to said output without any gates in between.

Figure 8:
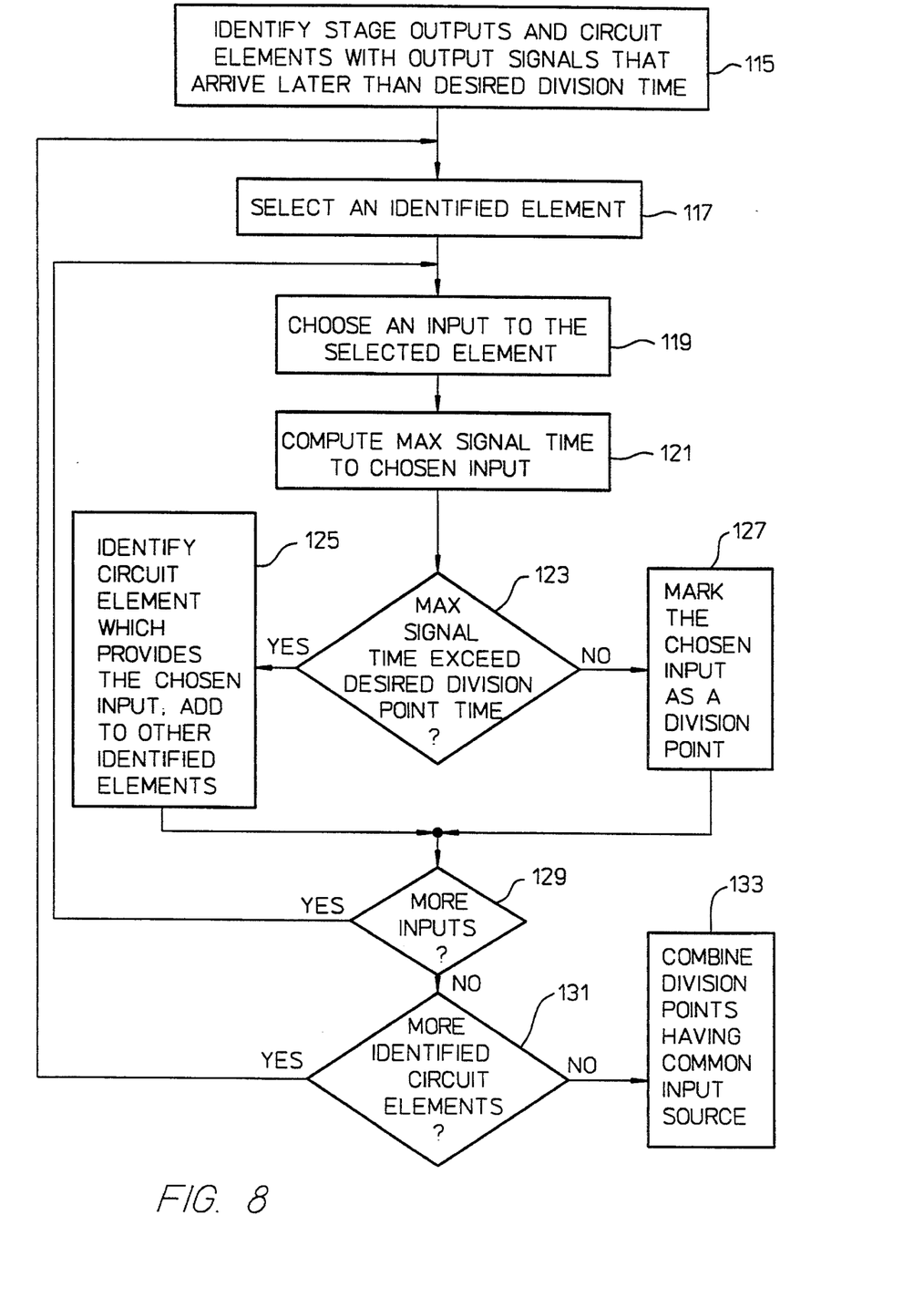
FIG. 8 is a flowchart showing details of the "compute division points" block of FIG. 7.

Referring now to FIG. 8, the step of automatically computing a division point preferably comprises the following steps:

(a) identifying each circuit element that provides an output of the existing pipeline stage (block 115);

(b) selecting any one of the identified circuit elements (block 117);

(c) choosing an input of the selected circuit element (block 119);

(d) computing the maximum signal processing time from the input of the existing pipeline stage through any possible circuit path to the chosen input (block 121);

(e) if said computed time exceeds the desired signal processing time ("YES" output of block 123), identify that circuit element which provides a signal to the chosen input (block 125);

(f) if said computed time does not exceed the desired signal processing time ("NO" output of block 123), identify the chosen input as a tentative division point (block 127);

(g) repeating steps (c) through (f) until there are no more inputs of the selected circuit element (block 129);

(h) repeating steps (b) through (g) until there are no more identified circuit elements (block 131); and (i) combining any tentative division points that receive a signal from a common source into a single division point (block 133).

Referring again to FIGS. 3 through 6, the actual division of the pipeline stage 51 according to the method of the invention will now be described. Assume it is desired to divide the stage such that the new input stage uses four time units. Also assume that each circuit element uses one time unit to provide its output after receiving its input.

Figure 4:
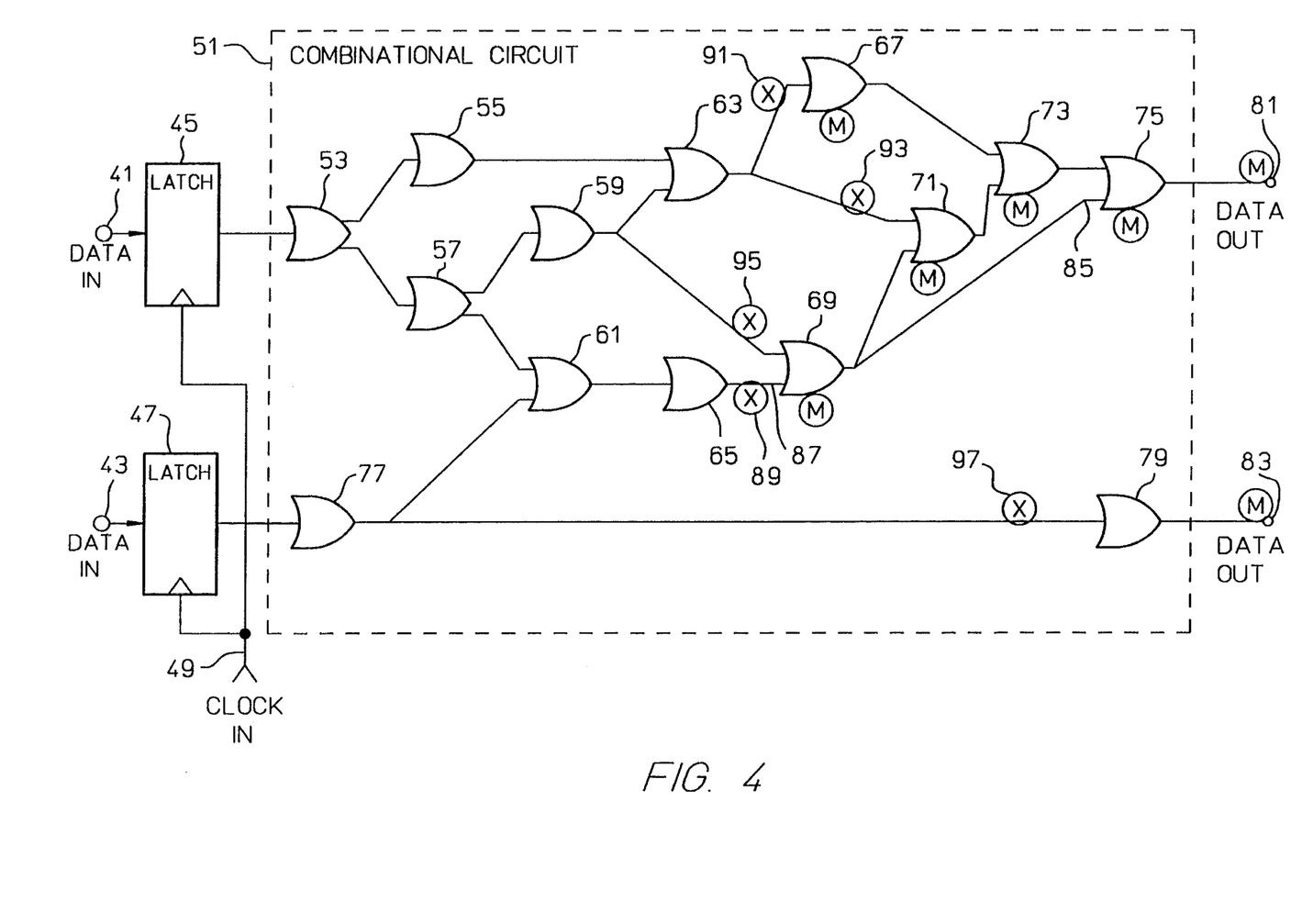
FIG. 4 shows the circuit of FIG. 3 after circuit elements and tentative division points have been identified according to the method of the invention.

First, the actual stage outputs 81 and 83 are identified as indicated by the letter "M" in FIG. 4. One of these, say 81, is selected and its only input is chosen. The maximum signal processing time through any possible path from the stage input to that chosen input is computed. In this case, the path which takes the longest would be the path that begins at the output of latch 45 and extends through the elements 53, 57, 61, 65, 69, 71, 73 and 75. This path has eight elements, thus the total time for the signal to travel through it would be eight time units. This is more than the desired division time of four time units, so the gate 75 which provides the signal to the chosen input is identified as indicated by a letter "M" in FIG. 4.

There are no more inputs to the output 81, so another identified element, say the element 75, is selected and one of its inputs, say an input 85, is chosen. The maximum time for a signal to reach this chosen input is seven time units. This is more than the desired time of four time units, thus the gate 69 which provides the signal at this point is identified as indicated by a letter "M".

Then the other input of the gate 75 is chosen and the same procedure results in identifying the gate 73.

Then another identified circuit element, say the gate 69, is selected and one of its inputs, say the input 87, is chosen. The maximum time for a signal to reach this input is four units, through the gates 53, 57, 61 and 65. This does not exceed the desired division time which is also four units, so this input is identified as a tentative division point 89, as indicated by a letter "X" in FIG. 4.

The process is continued until there are no more identified circuit elements to select and until no more inputs to any of the identified elements remain to be chosen. In the example, this process results in tentative identification of five division points: the points 89 as discussed above and the points 91, 93, 95 and 97.

Figure 5:
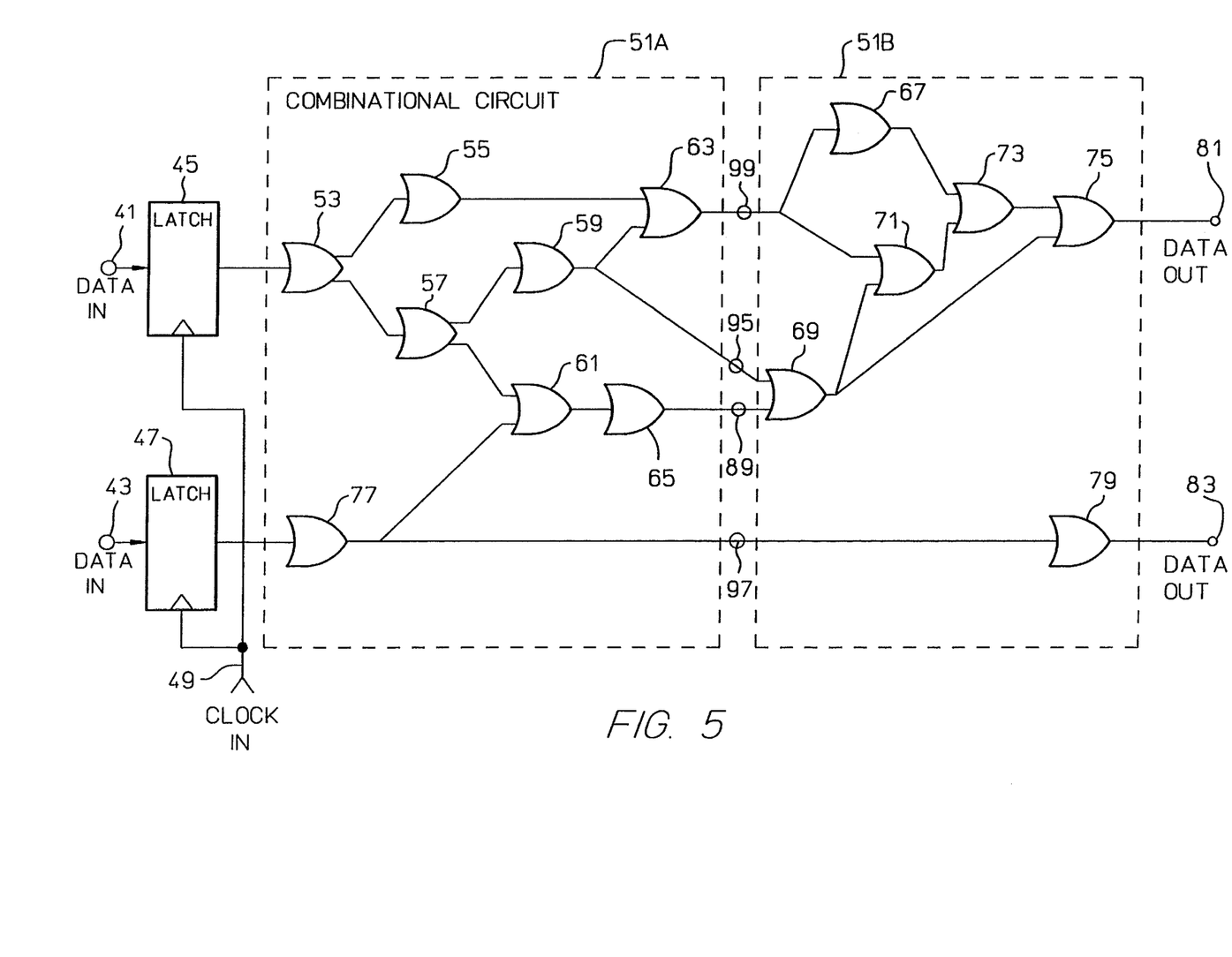
FIG. 5 shows the circuit of FIG. 3 as divided into two pipeline stages according to the method of the invention.

Finally, the inputs to these five tentative division points are examined and it is determined that the points 91 and 93 receive their inputs from a common source, specifically the gate 63. Accordingly, these two points are combined into a single division point 99 and the circuit is divided at the four division points 89, 95, 97 and 99 into a new input stage circuit 51A and a new output stage circuit 51B as shown in FIG. 5.

Figure 6:
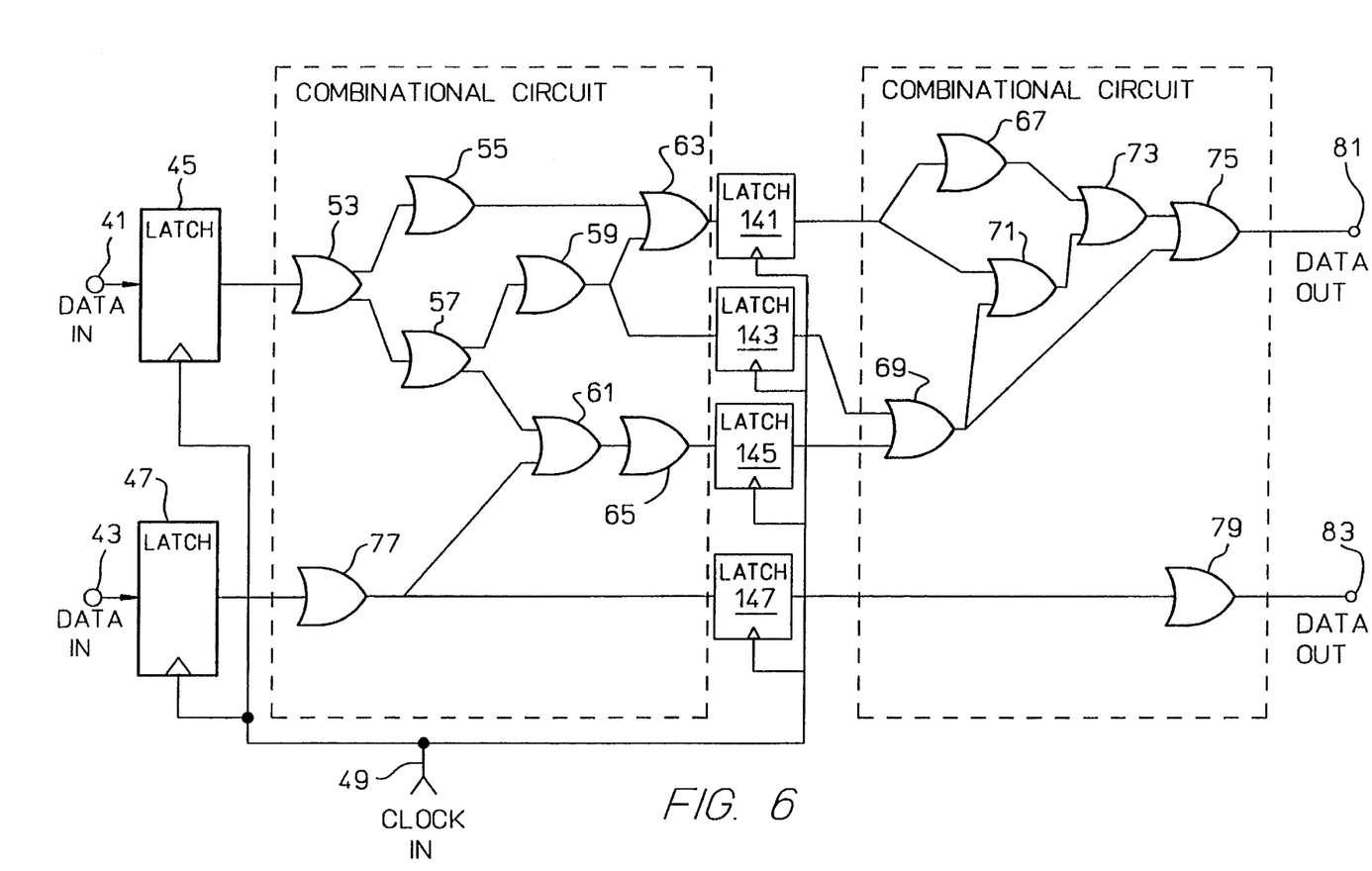
FIG. 6 shows the circuit of FIG. 5 with latches to complete the pipeline.

Optionally, a set of latches 141, 143, 145 and 147 may be inserted at these four division points between the circuits 51A and 51B, as shown in FIG. 6, to define a complete pipeline.

It will be apparent that it may be optimally efficient to compute the signal flow times through all possible paths in a single pass through the circuit 51 before performing the steps as outlined above and illustrated in FIG. 8o If this is done, the step of computing the maximum signal time for a chosen input (block 121) actually consists only of looking up the previously-computed time for that location in the circuit. Alternatively, in some embodiments it may be more efficient not to perform all the computations at once; in this case, the step of computing the maximum time consists of actually computing the signal travel times through all paths to the chosen input.

It will be apparent that the method of the invention may be applied repeatedly to divide a pipeline stage into as many additional stages as may be desired. At the conclusion of the process, the CAD system provides new netlists for the divided stages.

In one embodiment the designer initiates the division process by inserting a set of latches at the outputs of the stage to be divided and then instructing the system to move these latches backward to the desired division point. This provides a useful visual interface that enables the designer to picture what the system is automatically doing. It also enables the designer to assume a division, with an appropriate change in signal flow due to the additional set of latches, and then examine other aspects of the overall design, without waiting for the CAD system to actually perform the division.

From the foregoing it will be appreciated that the method of the invention provides a CAD system with the ability to automatically divide a pipeline stage consisting of an arbitrary logic network into two stages according to a criterion specified by the designer, thereby speeding the design process and simplifying the designer's work.

Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

I claim:

1. A method of automatically dividing a pipeline stage into two pipeline stages, the method comprising the following step performed in a computer-aided design system:

storing, in a storage area of said computer-aided design system, data descriptive of an existing pipeline stage that is to be divided, said pipeline stage having a plurality of circuit elements, each element having a characteristic signal processing time;

receiving a criterion descriptive of a desired division, the criterion including a desired signal processing time of the new input pipeline stage;

automatically computing a division point for each circuit branch in the existing pipeline stage, each such division point satisfying the criterion, the step of automatically computing a division point comprising:

identifying each circuit element for which the signal processing time from the input of the existing pipeline stage through any possible circuit path to the output of that circuit element exceeds the desired signal processing time;

identifying as a tentative division point each input of each identified circuit element for which the signal processing time from the input of the existing pipeline stage through any possible circuit path to that input does not exceed the desired signal processing time; and combining any tentative division points that receive a signal from a common source into a single division point; and automatically revising the data descriptive of the existing pipeline stage into data descriptive of a new input pipeline stage and a new output pipeline stage, the new input pipeline stage including all the circuitry of the existing pipeline stage which provides signals to the division points, the new output pipeline stage including all the circuitry of the existing pipeline stage which receives Signals from the division points.

2. A method of automatically dividing a pipeline stage into two pipeline stages, the method comprising the following steps performed in a computer-aided design system:

storing, in a storage area of said computer-aided design system, data descriptive of an existing pipeline stage that is to be divided, said pipeline stage having a plurality of circuit elements, each element having a characteristic signal processing time;

receiving a criterion descriptive of a desired division, the criterion including a desired signal processing time of the new input pipeline stage;

automatically computing a division point for each circuit branch in the existing pipeline stage, each such division point satisfying the criterion, the step of automatically computing a division point including the substeps of:

(a) identifying each circuit element that provides an output of the existing pipeline stage, the identified elements initially including each output point of the stage;

(b) selecting an identified circuit element;

(c) choosing an input of the selected circuit element;

(d) computing the maximum signal processing time from the input of the existing pipeline stage through any possible circuit path to the chosen input;

(e) if said computed time exceeds the desired signal processing time, identify that circuit element which provides a signal to the chosen input and including said identified element among those elements identified in step (a);

(f) if said computed time does not exceed the desired signal processing time, identify the chosen input as a tentative division point;

(g) repeating steps (c) through (f) until there are no more inputs of the selected circuit element;

(h) repeating steps (b) through (g) until there are no more identified circuit elements; and (i) combining any tentative division points that receive a signal from a common source into a single division point; and automatically revising the data descriptive of the existing pipeline stage into data descriptive of a new input pipeline stage and a new output pipeline stage, the new input pipeline stage including all the circuitry of the existing pipeline stage which provides signals to the division points, the new output pipeline stage including all the circuitry of the existing pipeline stage which receives signals from the division points.

* * * * *